(12) United States Patent
Ishida et al.

(10) Patent No.: US 7,061,019 B2
(45) Date of Patent: Jun. 13, 2006

(54) SEMICONDUCTOR CIRCUIT ARRAY SUBSTRATE WITH A PHOTO-ELECTRIC SENSOR PORTION

(75) Inventors: Arichika Ishida, Saitama-ken (JP);
Masayoshi Fuchi, Saitama-ken (JP);
Yuki Matsuura, Saitama-ken (JP);
Norio Tada, Saitama-ken (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 10/888,755

(22) Filed: Jul. 12, 2004

(65) Prior Publication Data
US 2005/0017318 A1    Jan. 27, 2005

(30) Foreign Application Priority Data
Jul. 22, 2003   (JP) .............................. 2003-277779

(51) Int. Cl.
*H01L 31/036* (2006.01)
(52) U.S. Cl. .............................. 257/72; 257/59; 257/66; 257/458
(58) Field of Classification Search ................ 257/57, 257/59, 66, 72, 458
See application file for complete search history.

(56) References Cited

U.S. PATENT DOCUMENTS 5,744,822 A * 4/1998 Takayama et al. ............ 257/66
6,875,999 B1 * 4/2005 Koyama et al. .............. 257/66

FOREIGN PATENT DOCUMENTS

JP    2959682    7/1999

* cited by examiner

*Primary Examiner*—Gene M. Munson
(74) *Attorney, Agent, or Firm*—Oblon, Spivak, McClelland, Maier & Neustadt, P.C.

(57) ABSTRACT

A circuit array substrate is provided with thin-film transistors 4 and 5 and PIN diode 6 formed on insulation substrate 3. Active layer 11 and photo-electric sensor portion 21 are made of poly-silicon films. Impurities are doped into active layer 11 and photo-electric sensor portion 21 in the same process chamber, if necessary, to make their impurity concentrations different from each other. Thin-film transistors 4 and 5 with prescribed characteristics and PIN diode 6 with improved photosensitivity can be simultaneously, easily manufactured on insulation substrate 3 with a lesser number of processes.

4 Claims, 12 Drawing Sheets

SEMICONDUCTOR CIRCUIT ARRAY SUBSTRATE WITH A PHOTO-ELECTRIC SENSOR PORTION

FIELD OF THE INVENTION

This invention generally relates to a circuit array substrate used for a display device and a method of manufacturing the same and, more particularly, to a circuit array substrate with switching elements used for a display device and a method of manufacturing the same.

This application is based upon and claims the benefit of priority from the prior Japanese Patent Application No. 2003-277779, filed on Jul. 22, 2003, the entire contents of which are incorporated in this application by reference.

DISCUSSION OF THE BACKGROUND

A liquid crystal display device is basically provided with a circuit array substrate, a counter substrate and a liquid crystal layer held between the circuit array substrate and the counter substrate. The circuit array substrate contains switching elements to operate pixels. Although amorphous-silicon thin-film transistors are still applicable to prior art switching elements, poly-silicon thin-film transistors have been recently developed to replace the amorphous-silicon thin-film transistors and put into practical use.

In order to make the poly-silicon thin-film transistors on the circuit array substrate, an amorphous-silicon film is formed on an insulation substrate, such as a glass substrate, the amorphous-silicon film is then annealed to re-crystallize as a poly-silicon film, and a patterning process is subsequently carried out to make the poly-silicon film an active layer for the poly-silicon thin-film transistors.

Next, a low-density P-type or N-type impurity is doped into the active layer (the "lightly doped active layer") to control a threshold voltage of the poly-silicon thin-film transistors and a gate insulation layer is formed on the insulation substrate containing the lightly doped active layer.

Further, an electrically conductive film is coated on the gate insulation layer and a patterning process is performed for the conductive film and gate insulation layer to form gate electrodes on the active layer. A high-density P-type or N-type impurity is doped into the active layer to form source and drain regions of the poly-silicon thin-film transistors.

Subsequently, after an interlayer insulation film is coated on the gate insulation layer and the gate electrodes, contact holes are made through the interlayer insulation film so as to reach the source and drain regions, respectively. The interlayer film and contact holes are covered with an electrically conductive film to which a patterning process is applied to form source and drain electrodes and signal lines.

Next, a protective film is coated on the source and drain electrodes and the interlayer film and contact holes are made through the protective film so as to reach the drain electrodes, respectively. The contact holes are filled with an electrically conductive film to connect the drain electrode to an external device. In this way, the circuit substrate is completed for the liquid crystal display device.

Additionally, data entry devices, such as photo-electric sensor elements, are provided on the glass substrate. The photo-electric sensor element may consist of a PIN photo-electric diode in which an I (intrinsic) layer generates photons on receipt of incident light.

As described above, the impurity is necessarily doped into the active layer for the thin-film transistor to obtain prescribed performance characteristics. In order to increase photo-electric sensitivities of the PIN diode, however, it is desirable that no impurity is doped into the I layer of the PIN diode.

Where the thin-film transistors are formed on the glass substrate in the same processes chamber as the photo-electric sensor elements, the impurity concentration cannot be changed. Thus, it is not easy to form thin-film transistors with prescribed performance characteristics and sensitivity-enhanced photo-electric sensor elements simultaneously. Those thin-film transistors and photo-electric sensor elements can be formed in separate processes in which different density impurities are doped into the active layers of the thin-film transistors and the I layers of photo-electric sensor elements, respectively. Such a manufacturing method, however, results in increase in the number of manufacturing processes and cannot be made easy and inexpensive in manufacturing cost.

Since, on the other hand, the poly-silicon active layer has high turned-on resistance, not only such pixel switching circuits but also driver circuits can be made of the poly-silicon active layer formed on the array substrate. In that case, however, the channel length of a poly-silicon thin-film transistor in the driver circuit should be short because an operating frequency of the driver circuit is usually required to be higher as the liquid crystal display device becomes finer in image resolution.

Generally, a withstand voltage at the drain electrode becomes lower as the channel length is set to be shorter. In other words, when the channel length is shorter, carriers are more concentrated at the drain electrode where the electric field is intensive, and drain avalanches are caused at a lower voltage. In fact, a very-large-scale-integration (VLSI) circuit has similar situations to it. That is, its channel length is shortened for high frequency operations but the VLSI circuit is used at a low power source voltage in compliance with its lowered withstand voltage. Such prior art technology is disclosed in Japanese Patent No. 2959682 (see its descriptions on pages 2 through 4 and FIG. 1).

A liquid crystal display device or an electro-luminescence display device is required to drive liquid crystal elements or electro-luminescence elements at a prescribed voltage. Thus, its entire power source voltage cannot be lowered, e.g., a liquid crystal element must be driven at a voltage not less than 10V.

In order to satisfy such contrary requirements that a display device operates at a high frequency with a high withstand voltage, thin-film transistors with different channel lengths are formed on a glass substrate. Those with short and long channel lengths are used for a high frequency operation and for a high withstand application, respectively.

FIGS. 27 and 28 show characteristics of drain current Id-gate voltage Vg (the "Id-Vg characteristics") in accordance with channel lengths where a poly-silicon thin-film is used for an active layer. According to the Id-Vg characteristics, as the channel length becomes shorter, the threshold voltage reduces and a turned-off current increases at the gate voltage Vg=0V. In short, these result from the fact that the active layer is an amorphous-silicon thin-film and maintains a middle band-gap level. Here, the turn-off current increase brings about increase in currents consumed in circuits or results in error circuit operations. Therefore, the mere change of channel lengths does not necessarily make thin-film transistors operate at high frequency or at a high withstand voltage.

SUMMARY OF THE INVENTION

Accordingly, the present invention provides a circuit array substrate with different switching elements and photo-electric sensors and a method of manufacturing the same in a small or lesser number of processes.

The first aspect of the present invention is directed to a circuit array substrate provided with an insulation substrate, a switching element having an active layer of a poly-crystalline semiconductor formed on the insulation substrate, a photo-electric semiconductor device having a photo-electric sensor portion of a poly-crystalline semiconductor formed on the insulation substrate, and impurities doped into the active layer and the photo-electric sensor portion in the same process chamber with different impurity concentrations.

Thus, the circuit array substrate containing the switching element with prescribed characteristics and the photo-electric semiconductor device with improved sensitivity can be easily manufactured on the insulation substrate with a relatively small number of processes.

The second aspect of the present invention is directed to a circuit array substrate provided with an insulation substrate, switching elements having active layers formed on the insulation substrate and impurities doped into the active layers in the same process chamber with different impurity concentrations. Thus, the circuit array substrate containing the switching element with different characteristics can be easily manufactured on the insulation substrate with a relatively small number of processes.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DESCRIPTION OF THE EMBODIMENTS

Figure 1:
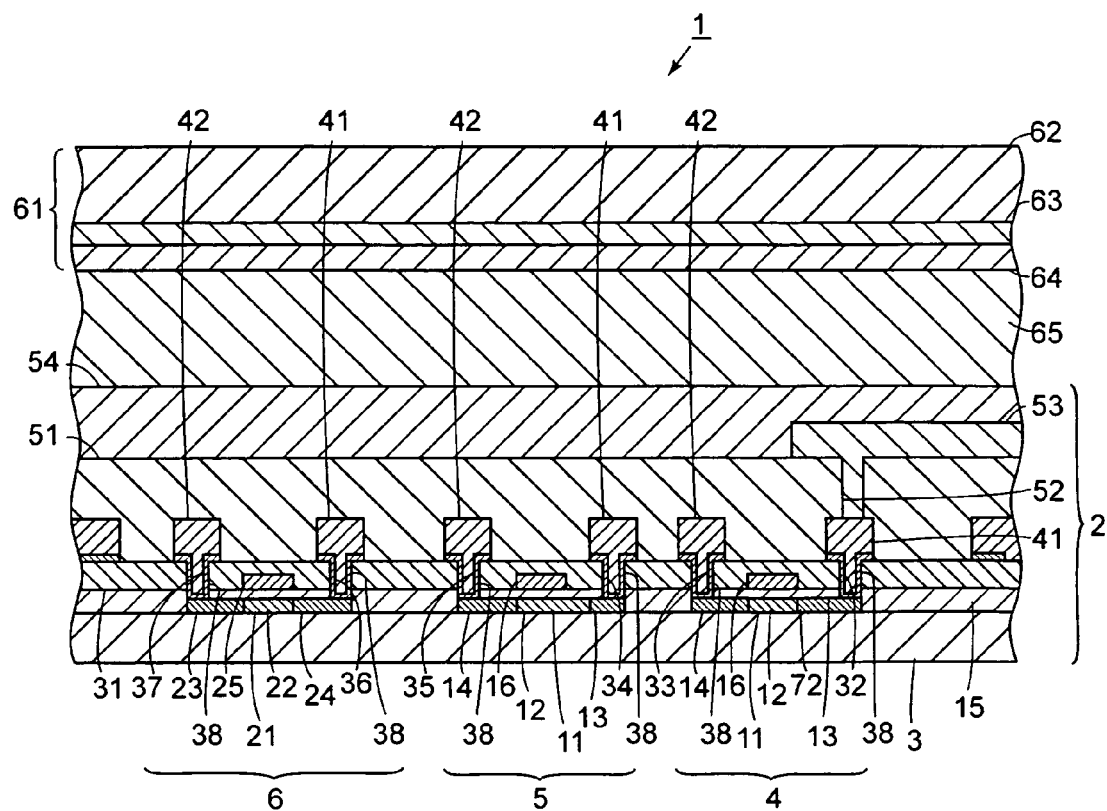
FIG. 1 is a cross-sectional view of a liquid crystal display device containing a circuit array substrate provided in accordance with the first embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components.

First Embodiment

A circuit array substrate of the first embodiment in accordance with the present invention will be explained with reference to FIGS. 1 through 13.

FIG. 1 is a cross-sectional view of a liquid crystal display device 1. Liquid crystal display device 1 is provided with rectangular circuit array substrate 2, counter substrate 61 and liquid crystal layer 65. Circuit array substrate 2 includes a transparent insulation plate, such as glass substrate 3. The upper surface of glass substrate 3 is covered with an undercoat layer not shown but made of silicon nitride and silicon oxide.

N-channel type thin-film transistors 4, P-channel type thin-film transistors 5 and photo-electric semiconductor devices 6, such as PIN diodes, are formed in a matrix on the undercoat layer. N-channel and P-channel type thin-film transistors 4 and 5 are used for switching elements of the liquid crystal display while PIN diodes 6 are used for photo-electric sensor elements.

Here, thin-film transistors 4 and 5 have active layers 11 formed on the undercoat layer. Each active layer 11 consists of a poly-crystalline semiconductor film, such as a poly-silicon film, made by annealing an amorphous-semiconductor film, such as an amorphous-silicon film, formed on the undercoat layer. Active layer 11 has channel region 12 at its central portion and $N^+$ or $P^+$ source and drain regions 13 and 14 on both sides of channel region 12, respectively.

The undercoat layer and active layer 11 formed on the undercoat layer are covered with gate insulation film 15 made of silicon oxide. Gate electrodes 16 are formed on gate insulation film 15 opposite to channel regions 12. The width of each gate electrode 16 is approximately equal to that of channel region 12.

Further, PIN diodes 6 are formed on the undercoat layer. PIN diode 6 consists of a poly-crystalline semiconductor film, such as a poly-silicon film, made by annealing an amorphous-semiconductor film, such as an amorphous-silicon film, formed on the undercoat layer.

PIN diodes 6 are arranged on the same plane as thin-film transistors 4 and 5 formed on glass substrate 3. Each PIN diode 6 has photo-electric sensor portion 21 which is formed on the undercoat layer and into which P-type or N-type impurity (dopant) is doped by the same process as active layer 11 of thin-film transistors 4 and 5. The impurity concentration of photo-electric sensor portion 21 is different from that of active layers 11 of thin-film transistors 4 and 5.

Photo-electric sensor portion 21 has intrinsic (I) layer 22 provided at the center region of PIN diode 6 and $P^+$ poly-silicon region 23 and $N^+$ poly-silicon region 24 on both sides of I layer 22, respectively.

Photo-electric sensor portion 21 and the undercoat layer are covered with gate insulation film 15. Gate electrodes 25 are formed by applying the same process to the same insulation film 15 as gate electrodes 16 of thin-film transistors 4 and 5. Further, gate electrodes 25 are substantially the same in width as I layers 22 of photo-electric sensor portion 21.

Gate electrodes 25 of PIN diode 6, gate electrodes 16 of thin-film transistors 4 and 5 and gate insulation film 15 are covered with interlayer insulation film 31 made of silicon oxide.

Contact holes 32 and 33 are made through interlayer insulation film 31 and gate insulation film 15 to reach source and drain regions 13 and 14 of N-channel type thin-film transistor 4, respectively.

Likewise, contact holes 34 and 35 are also made through interlayer insulation film 31 and gate insulation film 15 to reach source and drain regions 13 and 14 of P-channel type thin-film transistor 5, respectively.

Contact holes 36 and 37 are further made through interlayer insulation film 31 and gate insulation film 15 to reach $P^+$ and $N^+$ regions 23 and 24 provided on both ends of I layer 22 of PIN diode 6, respectively.

Contact holes 32 and 34 are filled with ohmic contact film 38 and then electrically-conductive materials of source electrodes 41. Thus, source electrodes 41 are electrically connected between signal lines (not shown) and source regions 13 of thin-film transistors 4 and 5 through ohmic contact film 38.

Likewise, contact holes 33 and 35 are also filled with ohmic contact film 38 and then electrically-conductive materials of drain electrodes 42. Thus, drain electrodes 42 are electrically connected to drain regions 14 of thin-film transistors 4 and 5 through ohmic contact film 38, respectively.

Contact hole 36 is further filled with ohmic contact film 38 and then electrically-conductive materials of source electrode 41. Thus, source electrode 41 is electrically connected to $N^+$ region 24 of PIN diode 6 through ohmic contact film 38. Contact hole 37 is filled with ohmic contact film 38 and then electrically-conductive materials of drain electrode 42. Thus, drain electrode 42 is electrically connected to $P^+$ region 23 of PIN diode 6 through ohmic contact film 38.

Protective film 51 is formed on source and drain electrodes 41 and 42 of thin-film transistors 4 and 5 and PIN diode 6 and interlayer insulation film 31. Contact hole 52 is made through protective film 51 reaching source electrode 41 of N-channel type thin-film transistor 4.

Electrically conductive materials of pixel electrode 53 are deposited on protective film 51 and in contact hole 52 so that pixel electrode 53 is electrically connected to source electrode 41. Thus, pixel electrode 53 is controlled by N-channel type thin-film transistor 4. Further, alignment film 54 is formed on pixel electrode 53 and protective film 51.

Rectangular counter substrate 6 is provided opposite to circuit array substrate 2. Counter substrate 6 includes rectangular glass substrate 62, counter electrode 63 and alignment film 64. Liquid crystal layer 65 is held between circuit array and counter substrates 2 and 61 and is sealed around circumference portions of the liquid crystal display device.

A method of manufacturing a circuit array substrate of the first embodiment of the present invention will be explained below with reference to the attached drawings.

Figure 2:
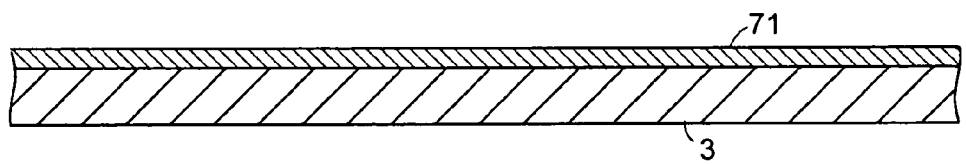
FIG. 2 is a cross-sectional view to explain the forming of a poly-silicon film on an insulation substrate in the circuit array substrate shown in FIG. 1.

First, as shown in FIG. 2, after an undercoat layer is formed on glass substrate 3, a plasma chemical vapor deposition (plasma CVD) method is applied to deposit 50 nm thick amorphous-silicon thin-film 71 on the undercoat layer.

Excimer laser is then irradiated to amorphous-silicon thin-film 71 so that amorphous-silicon thin-film 71 is melted and then re-crystallized into poly-silicon film 72.

Figure 3:
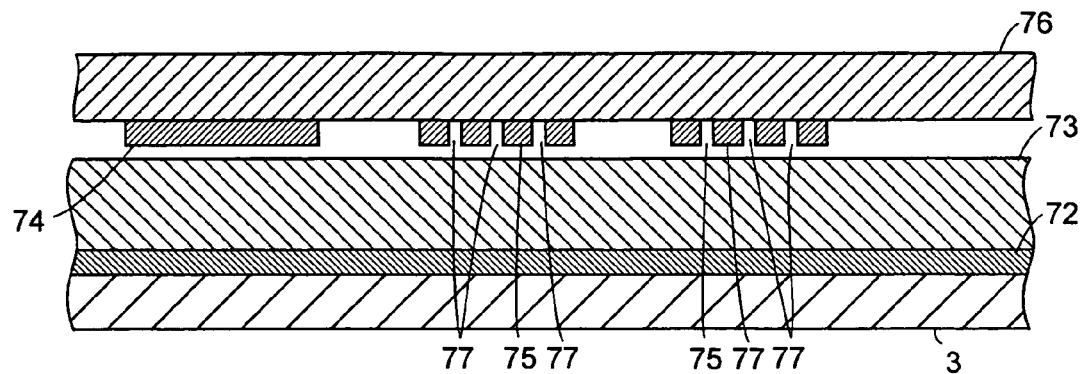
FIG. 3 is a cross-sectional view to explain the coating of a photo-resist on the poly-silicon film shown in FIG. 2 and the preparation of a mask pattern provided over the photo-resist.

Next, as shown in FIG. 3, a positive type photo-resist is coated on the surface of poly-silicon film 72 by a spin coater to form 2.0 μm thick photo-resist 73.

Subsequently, mask pattern 76 is prepared to oppose photo-resist 73. Mask pattern 76 is provided with light shield portions 74 and translucent portions 75 corresponding to PIN diode 6 and thin-film transistors 4 and 5, respectively. Photo-resist 73 is exposed by an exposure machine (not shown) while maintaining mask pattern 76 opposite to photo-resist 73.

Translucent portion 75 of mask pattern 76 consists of a line and space pattern, i.e., a plurality of equally-spaced slits 77.

As a result of the exposure, there are completely exposed portions, unexposed portions and intermediate portions exposed with intermediate exposure energy on photo-resist 73.

Figure 4:
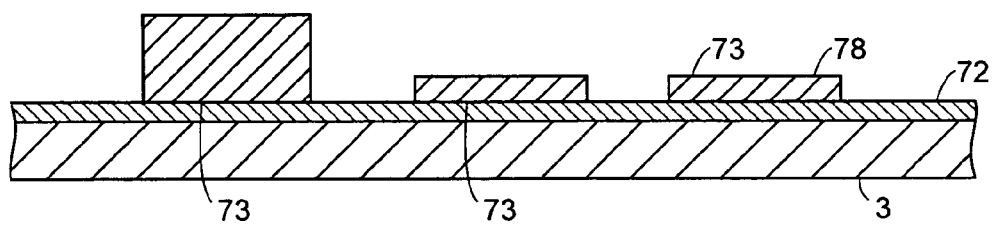
FIG. 4 is a cross-sectional view to explain a configuration made by the optical exposure and development of the photo-resist on the poly-silicon film through the mask pattern provided over the photo-resist shown in FIG. 3.

Further, exposed photo-resist 73 is developed in a developing solution. Since solubility of completely exposed portions, unexposed portions and intermediate portions are different from each other, photo-resist 73 becomes resist patterns 78 with different thicknesses as shown in FIG. 4.

Figure 5:
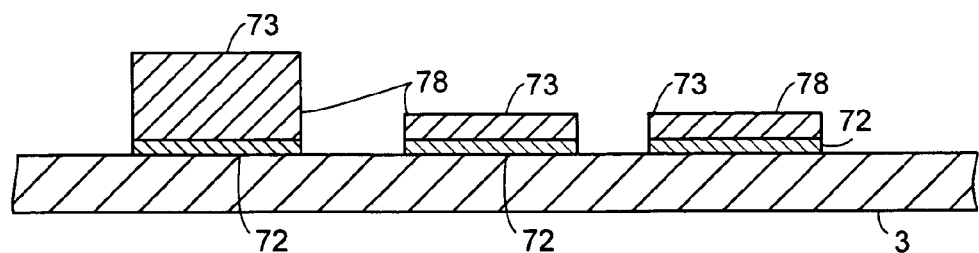
FIG. 5 is a cross-sectional view to explain a configuration made by etching a poly-silicon film formed on the insulation substrate shown in FIG. 4.

Patterning is carried out to form island-like patterns by applying dry etching with an etching gas of $CF_4$ to poly-silicon film 72 on glass substrate 3 through resist patterns 78 as a mask pattern as shown in FIG. 5.

Subsequently, $O_2$ plasma light ashing is performed for island-like resist patterns 78 formed on poly-silicon film 72 in the same process chamber as the dry etching.

Figure 6:
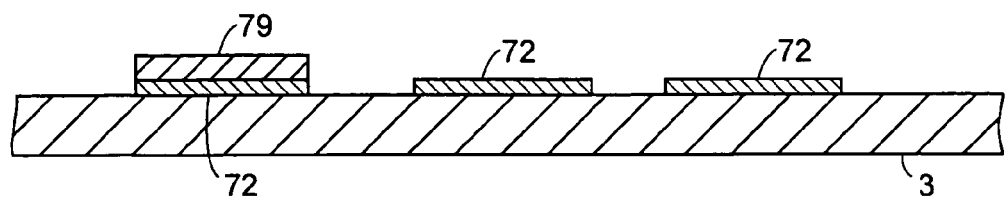
FIG. 6 is a cross-sectional view to explain a configuration made by the light ashing of thin photo-resist coated on the poly-silicon film shown in FIG. 5.

As shown in FIG. 6, the ashing process eliminates thin resist patterns 78 exposed with translucent portion 75 of mask pattern 76 from island-like poly-silicon film 72 for active layer 11 of thin-film transistors 4 and 5.

The ashing makes thick resist pattern 78 exposed with light shield portion 74 of mask pattern 76 relatively thin but cannot completely remove pattern 76 from photo-electric sensor portion 21 of PIN diode 6 so that resist pattern 79 remains there.

Figure 7:
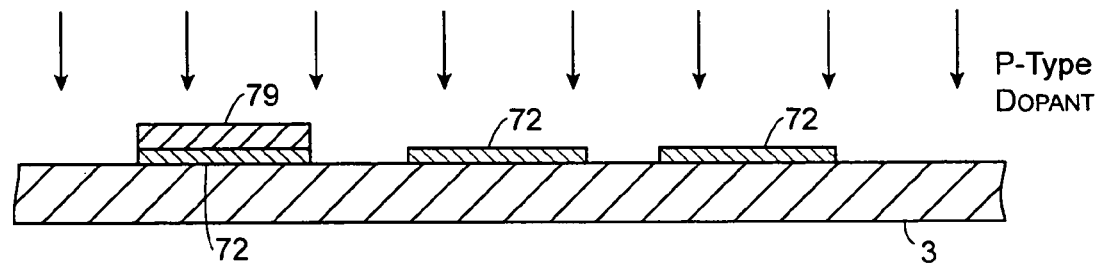
FIG. 7 is a cross-sectional view to explain the doping of a P-type impurity into the poly-silicon film shown in FIG. 6.

Next, as shown in FIG. 7, P-type impurity (dopant) is lightly doped into island-like poly-silicon film 72 by applying an implantation method through remaining resist pattern 79 as a mask pattern. 02 plasma ashing is then applied to remove remaining resist pattern 79 from island-like poly-silicon film 72.

Next, photo-resists 81 are formed on portions corresponding to I layer 22 and $P^+$ region 23 of PIN diode 6, channel, source and drain regions 12, 13 and 14 of P-channel type thin-film transistor 5, and channel region 12 of N-channel type thin-film transistor 4, respectively.

Figure 8:
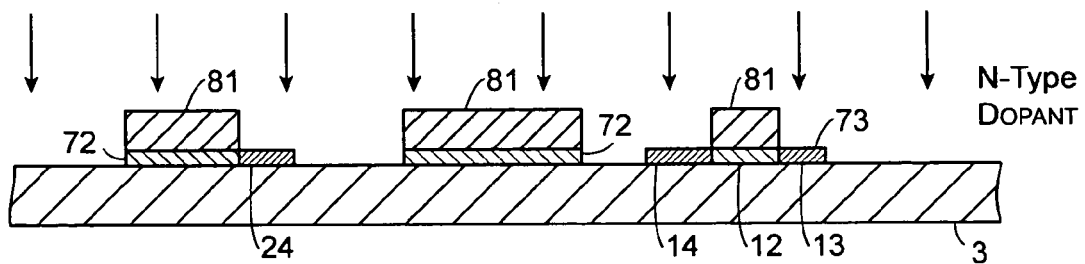
FIG. 8 is a cross-sectional view to explain the doping of an N-type impurity into the poly-silicon film shown in FIG. 7.

With this state maintained, as shown in FIG. 8, highly-concentrated N-type impurity (dopant) is doped into portions of island-like poly-silicon films 72 corresponding to $N^+$ region 24 of PIN diode 6, and source and drain regions 13 and 14 of N-channel type thin-film transistor 4 by applying an implantation method through resist pattern 81 as a mask pattern.

Figure 9:
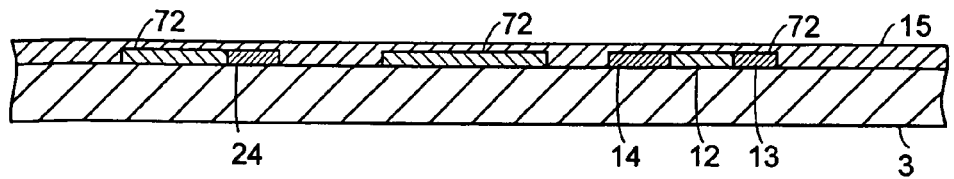
FIG. 9 is a cross-sectional view to explain the coating of a gate insulation film on the poly-silicon film and the insulation substrate shown in FIG. 8.

Photo-resists 81 are then removed from island-like poly-silicon films 72 and gate insulation film 15 is deposited on the undercoat layer and island-like poly-silicon films 72 as shown in FIG. 9. Electrically conductive film 82 is then deposited on gate insulation film 15. Subsequently, a patterning process is applied to electrically conductive film 82 to form gate electrodes 16 and 25.

Gate electrodes 16 are formed on channel region 12 of P-channel type thin-film transistor 5, and channel region 12 and source and drain regions 13 and 14 of N-channel type thin-film transistor 4 while gate electrode 25 is formed on channel region 12 and $N^+$ region 24 of PIN diode 6.

Figure 10:
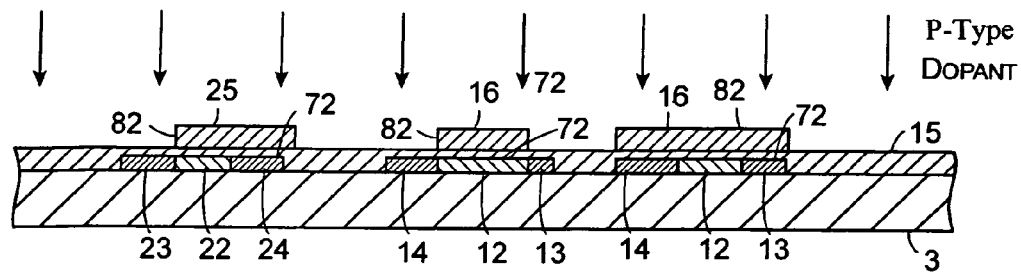
FIG. 10 is a cross-sectional view to explain the doping of an impurity into the poly-silicon film shown in FIG. 9 through gate electrodes formed on the gate insulation film as a mask pattern.

As shown in FIG. 10, highly-concentrated P-type impurity (dopant) is doped into portions of island-like poly-silicon films 72 corresponding to $P^+$ region 23 of PIN diode 6, and source and drain regions 13 and 14 of P-channel type thin-film transistor 5 by applying an implantation method through gate electrodes 16 and 25 as a mask pattern.

Figure 11:
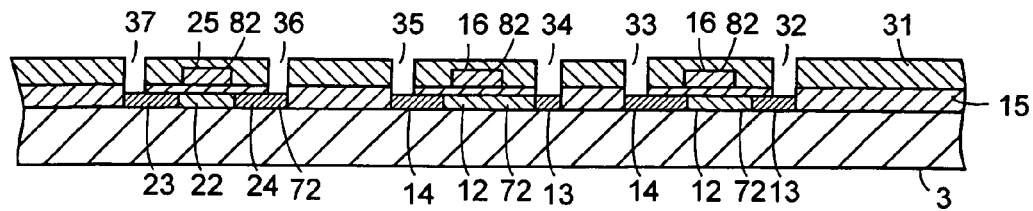
FIG. 11 is a cross-sectional view to explain contact holes made through the gate insulation film and an interlayer insulation film to cover the gate electrodes and the gate insulation film formed on the poly-silicon film and the insulation substrate shown in FIG. 10.

As shown in FIG. 11, a patterning process is applied to electrically conductive film 82 to form gate electrodes 16 and 25, interlayer insulation film 31 is deposited on gate electrodes 16 and 25 and gate insulation film 15, and contact holes 32 through 37 are made through interlayer insulation film 31.

Figure 12:
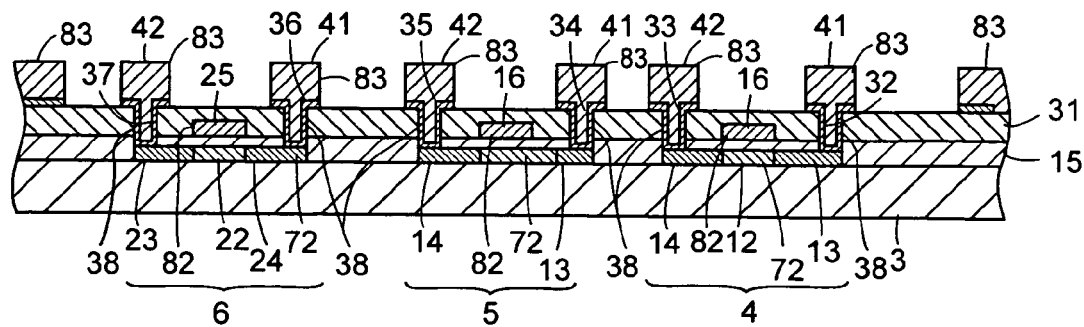
FIG. 12 is a cross-sectional view to explain source and drain electrodes provided at the contact holes shown in FIG. 11.

Subsequently, as shown in FIG. 12, electrically conductive film 83 is filled in contact holes 32 through 37 and also formed on interlayer insulation film 31, and a patterning method is applied to conductive film 83 to form source and drain electrodes 41 and 42 of thin-film transistors 4 and 5 and PIN diode 6.

Figure 13:
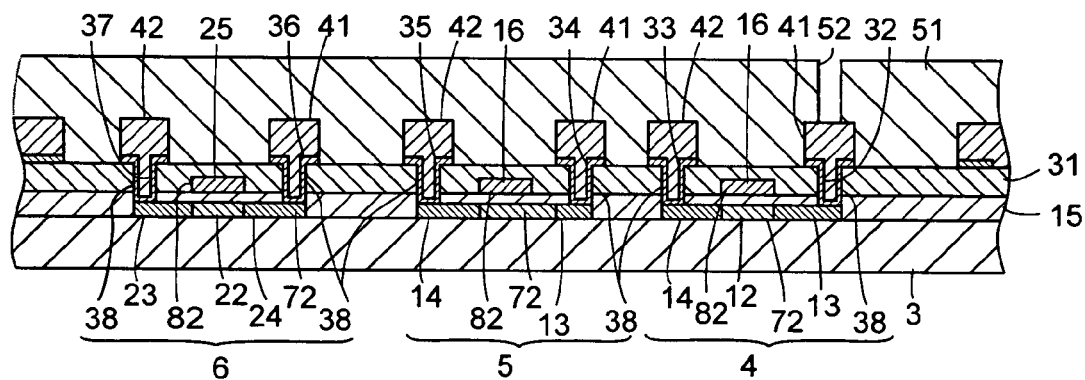
FIG. 13 is a cross-sectional view to explain the coating of a protective film on the source and drain electrodes and the interlayer film shown in FIG. 12.

Next, as shown in FIG. 13, protective film 51 is formed on source and drain electrodes 41 and 42 and contact hole 52 is then made through protective film 51.

Subsequently, a connecting portion of pixel electrode 53 is filled in contact hole 52 and pixel electrode 53 is formed on protective film 51 and alignment film 54 is then formed on pixel electrode 53 and protective film 51 so that a circuit array substrate 2 is completed as shown in FIG. 1.

As described above, according to the first embodiment, the doped impurity concentrations are different among thin-film transistors 4 and 5 and PIN diode 6 formed on glass substrate 4. That is, the first embodiment includes such a process that photo-resist 73 is exposed through mask pattern 76 with different transparency components of light shield portion 74 and translucent portion 75 to make the doped impurity concentrations different among thin-film transistors 4 and 5 and PIN diode 6.

It produces resist pattern 78 with films of different thickness on poly-silicon film 72 formed on glass substrate 3. Further, poly-silicon film 72 is etched through resist pattern 78 as a mask pattern and resist pattern 78 is then ashed to remove thin portions of resist pattern 78. After impurity is doped into poly-silicon film 72 through thick resist pattern 79 as a mask pattern, resist pattern 79 is removed from poly-silicon film 72.

Thus, thin-film transistors 4 and 5 with desired performance characteristics and PIN diode 6 with improved photosensitivity are easily formed on the same glass substrate 3 with a small or lower number of manufacturing processes. Since etching and light ashing processes, in particular, are sequentially carried out in the same reaction chamber, the increased number of processes can be minimized. Accordingly, since the number of lithography processes remain unchanged while the total number of manufacturing processes increases only slightly, circuit array substrate 2 provided with thin-film transistors 4 and 5 and PIN diode 6 can be produced at a low cost.

Second Embodiment

A circuit array substrate of the second embodiment of the present invention will be described with reference to FIGS. 14 through 26.

Although a circuit array substrate and a method of manufacturing the same shown in FIGS. 14 through 26 is basically the same as those shown in FIGS. 1 through 13, the former is provided with N-channel type thin-film transistors 91, 92 and 93 formed on glass substrate which have different channel lengths.

Figure 14:
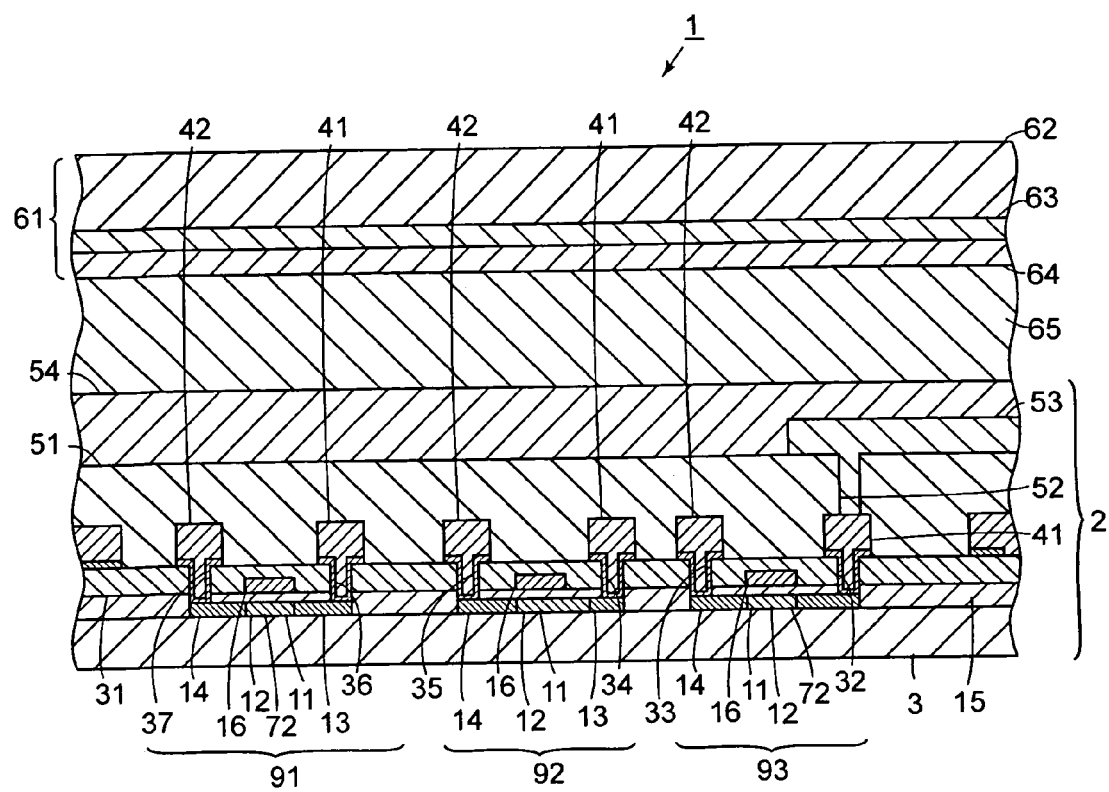
FIG. 14 is a cross-sectional view of a liquid crystal display device containing a circuit array substrate in accordance with the second embodiment of the present invention.
Figure 15:
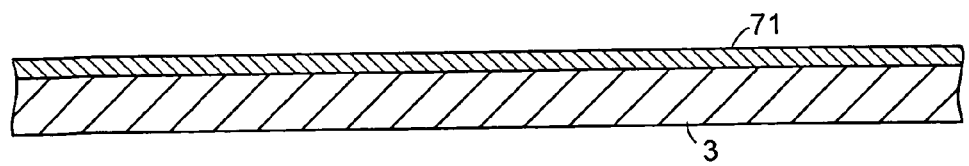
FIG. 15 is a cross-sectional view to explain the forming of a poly-silicon film on an insulation substrate in the circuit array substrate shown in FIG. 14.
Figure 16:
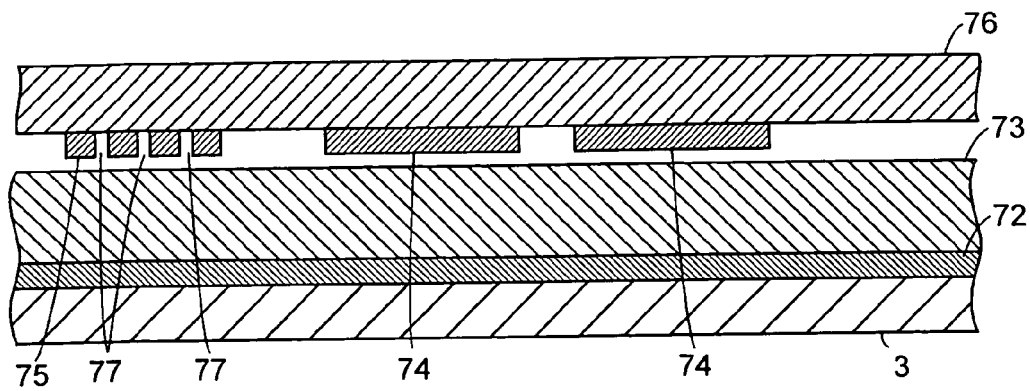
FIG. 16 is a cross-sectional view to explain the coating of a photo-resist coated on the poly-silicon film shown in FIG. 15 and the preparation of a mask pattern over the photo-resist.

As-shown in FIG. 15, an amorphous semiconductor film, such as amorphous-silicon film 71, is formed on glass substrate 3 and is then made into a poly-silicon film by laser-beam annealing. Next, as shown in FIG. 16, mask pattern 76 is prepared to oppose photo-resist 73. Mask pattern 76 is provided with light shield portions 74 and translucent portions 75 corresponding to long-channel thin-film transistors 92 and 93 and short-channel thin-film transistors 91 (see FIG. 14), respectively. The exposure of photo-resist 73 is performed through mask pattern 76.

Figure 17:
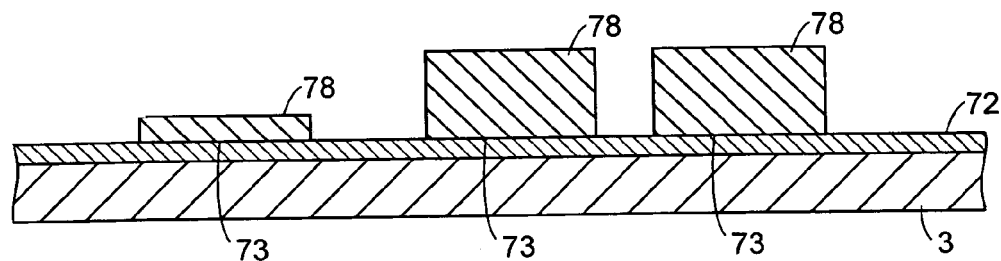
FIG. 17 is a cross-sectional view to explain a configuration made by the optical exposure and development of the photo-resist on the amorphous-silicon film through the mask pattern provided over the photo-resist shown in FIG. 16.
Figure 18:
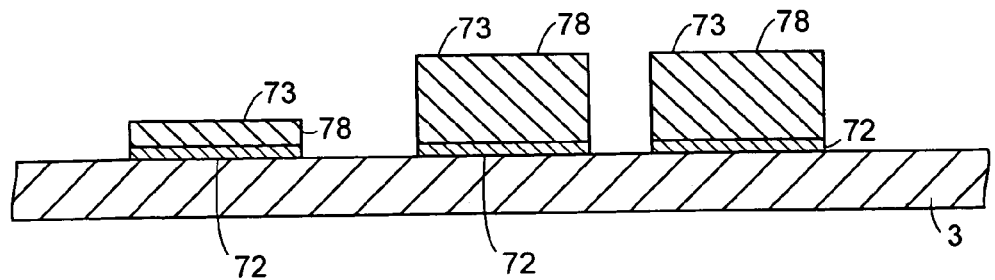
FIG. 18 is a cross-sectional view to explain a configuration made by etching a poly-silicon film formed on the insulation substrate shown in FIG. 17.

Further, exposed photo-resist 73 is developed in a developing solution to make resist patterns 78 formed on photo-resist 73 different in thicknesses as shown in FIG. 17. Patterning is then carried out to form island-like patterns by applying dry etching to poly-silicon film 72 on glass substrate 3 through resist patterns 78 as a mask pattern as shown in FIG. 18.

Figure 19:
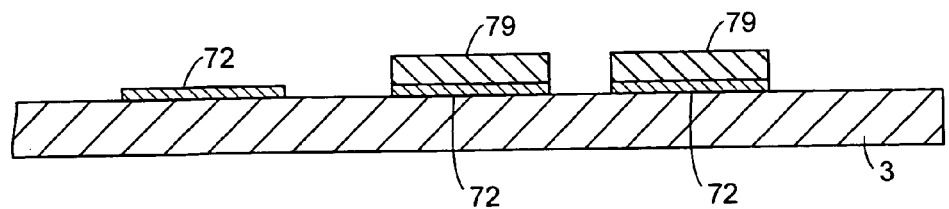
FIG. 19 is a cross-sectional view to explain a configuration made by the light ashing of thin photo-resist coated on the poly-silicon film shown in FIG. 18.

Subsequently, light ashing is performed for island-like resist patterns 78 formed on poly-silicon film 72. The ashing eliminates thin resist patterns 78 exposed with translucent portion 75 of mask pattern 76 from island-like poly-silicon film 72. The ashing leaves thick resist pattern 78 blocked from exposure by light shield portion 74 of mask pattern 76 as shown in FIG. 19.

Figure 20:
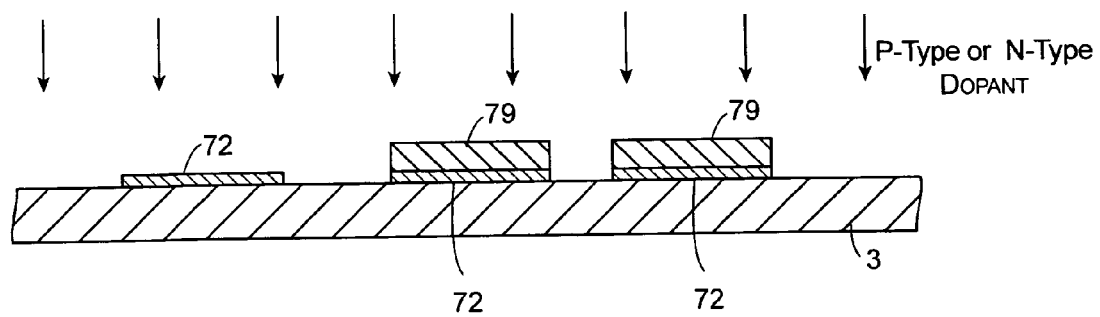
FIG. 20 is a cross-sectional view to explain the doping of a P-type or N-type impurity into the poly-silicon film shown in FIG. 19.

Next, as shown in FIG. 20, P-type or N-type impurity (dopant) is doped into island-like poly-silicon film 72 by applying an implantation method through remaining resist pattern 79 as a mask pattern. A threshold voltage of short-channel thin-film transistor 91 (see FIG. 14) is controlled by doped impurity concentrations. For example, boron is doped into poly-silicon film 72 of short-channel thin-film transistor 91 to shift the threshold voltage by 0.3 V in the positive direction.

Figure 21:
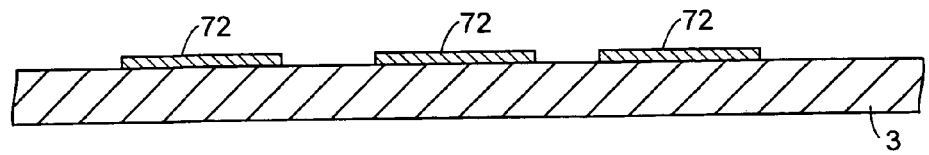
FIG. 21 is a cross-sectional view to explain the removal of thin photo-resist from the poly-silicon film shown in FIG. 20.
Figure 22:
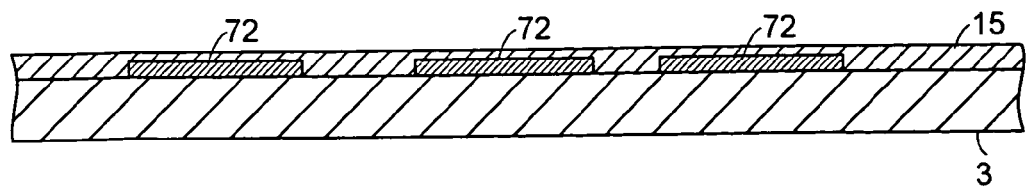
FIG. 22 is a cross-sectional view to explain the coating of a gate insulation film on the poly-silicon film and the insulation substrate shown in FIG. 21.
Figure 23:
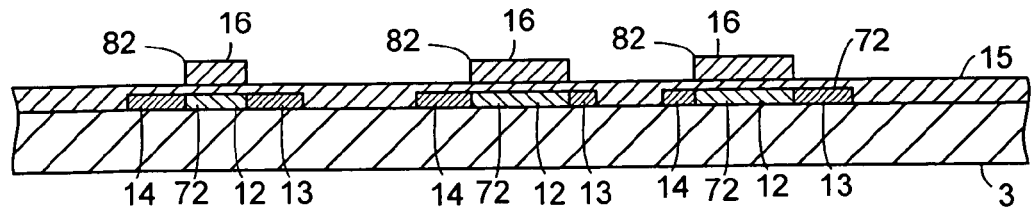
FIG. 23 is a cross-sectional view to explain the doping of an impurity into the poly-silicon film shown in FIG. 22 through gate electrodes formed on the gate insulation film as a mask pattern.

Subsequently, as shown in FIG. 21, remaining resist pattern 79 is removed from island-like poly-silicon film 72 formed on glass substrate 3. As shown in FIG. 22, gate insulation film 15 is then deposited on the undercoat layer and island-like poly-silicon films 72. In order to make a structure shown in FIG. 23, electrically conductive film 82 is deposited on gate insulation film 15 and a patterning process is applied to the electrically conductive film 82 to form gate electrodes 16.

Here, highly-concentrated P-type or N-type impurity is doped into portions of island-like poly-silicon films 72 corresponding to source and drain regions 13 and 14 of thin-film transistors 91, 92 and 93 (See FIG. 14) by applying an implantation method through gate electrodes 16 as a mask pattern. Concretely, after phosphorous, for example, is doped into island-like poly-silicon films 72, an annealing process is carried out to activate phosphorous doped poly-silicon films 72. As a result, doped impurity concentrations in active layer 11 of thin-film transistors 91, 92 and 93 (see FIG. 14) are different depending on gate-electrode lengths of thin-film transistors 91, 92 and 93.

Figure 24:
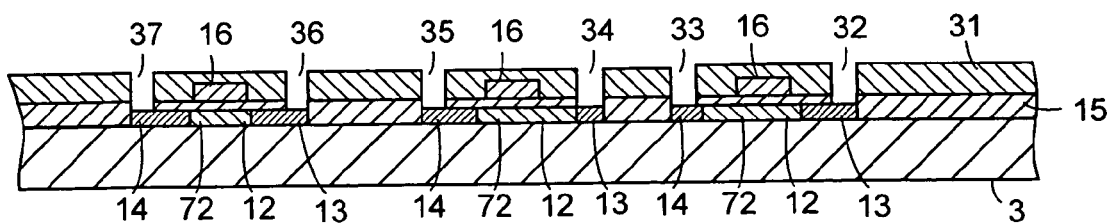
FIG. 24 is a cross-sectional view to explain contact holes made through the gate insulation film and an interlayer insulation film to cover the gate electrodes and the gate insulation film formed on the poly-silicon film and the insulation substrate shown in FIG. 23.
Figure 25:
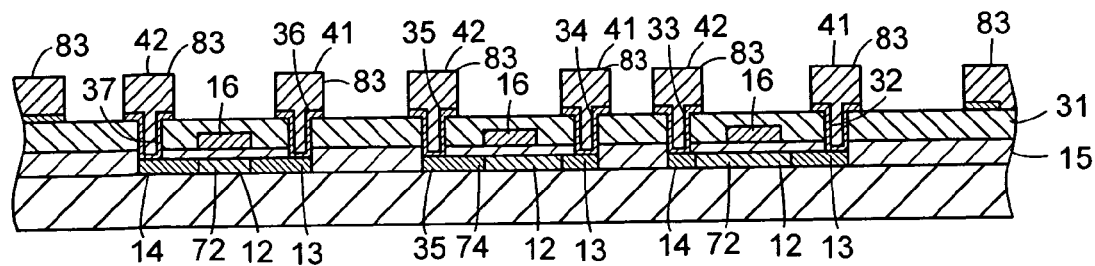
FIG. 25 is a cross-sectional view to explain source and drain electrodes provided at the contact holes shown in FIG. 24.

After a patterning process is performed for gate electrodes 16, interlayer insulation film 31 is formed on gate electrodes 16 and gate insulation film 15. As shown in FIG. 24, contact holes 32 through 37 are made through interlayer insulation film 31 and electrically conductive film 83 is filled in contact holes 32 through 37 and also coated on interlayer insulation film 31. As shown in FIG. 25, patterning method is then applied to conductive film 83 to form source and drain electrodes 41 and 42 of thin-film transistors 91, 92 and 93.

Figure 26:
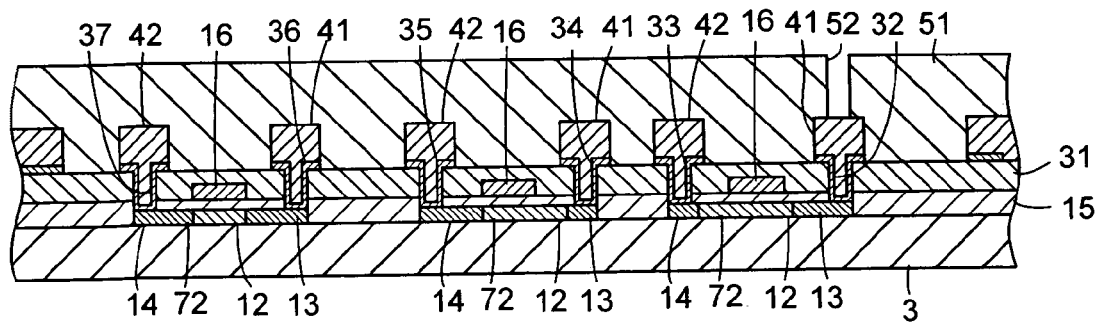
FIG. 26 is a cross-sectional view to explain the coating of a protective film on the source and drain electrodes and the interlayer film shown in FIG. 25.
Figure 27:
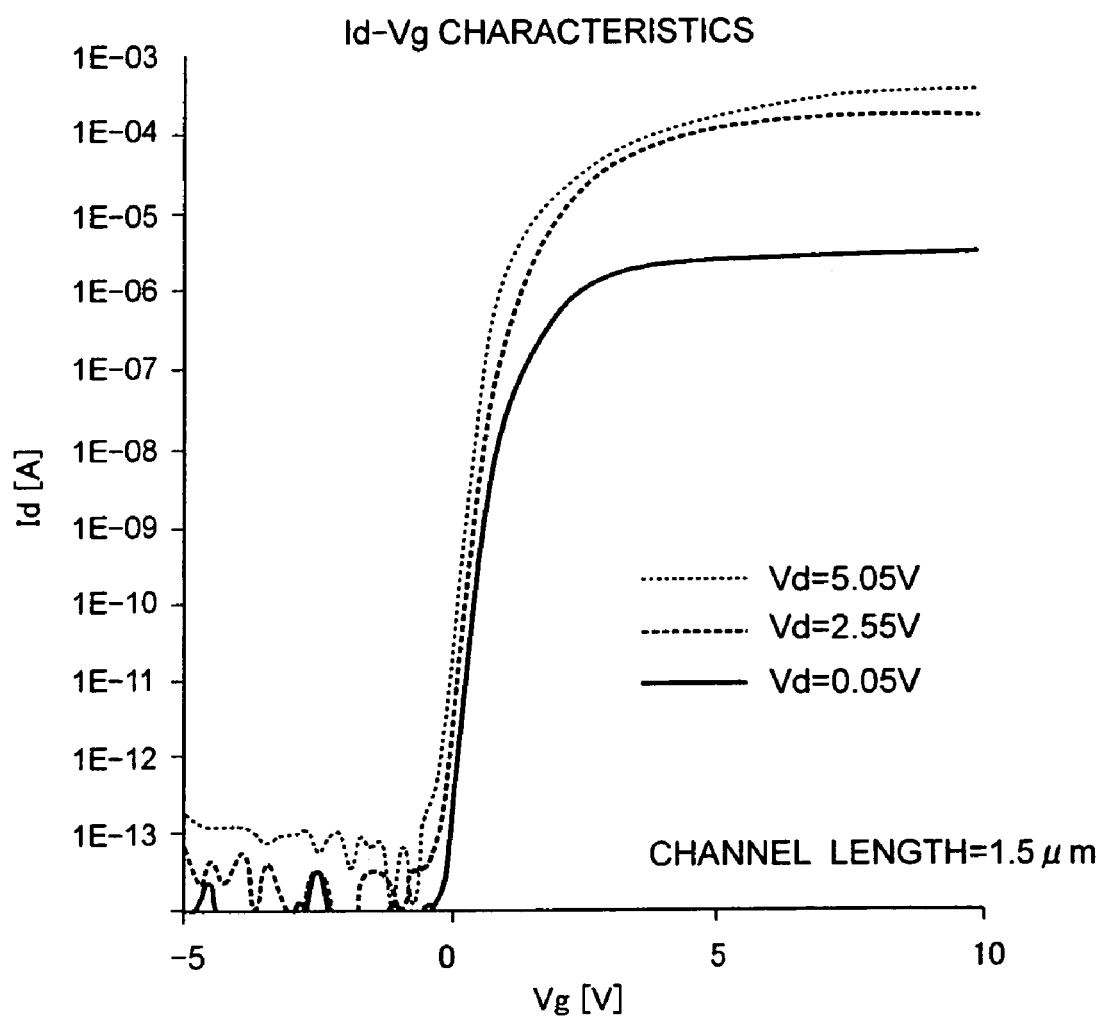
FIG. 27 is a graph to show drain current-gate voltage characteristics of a poly-crystalline semiconductor thin-film transistor with a channel length of 1.5 μm.
Figure 28:
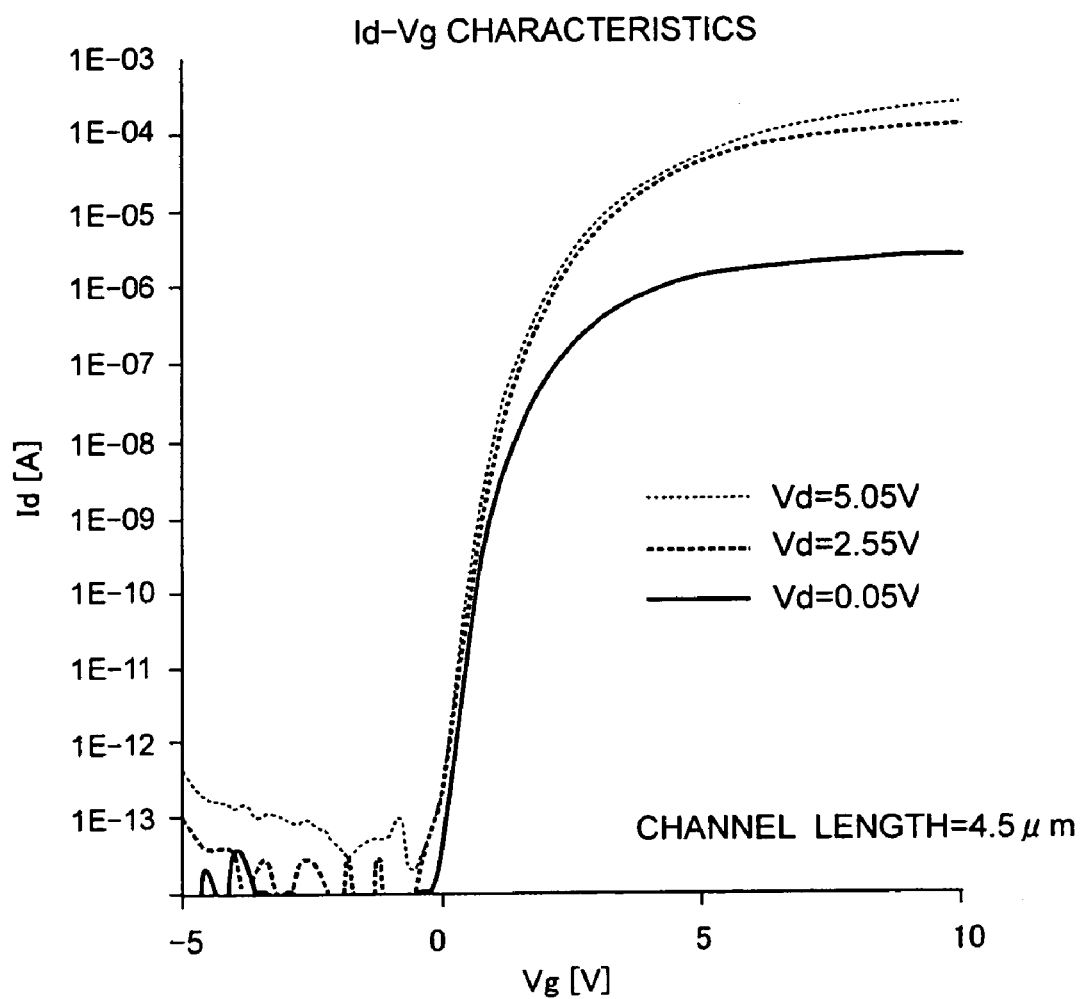
FIG. 28 is a graph to show drain current-gate voltage characteristics of a poly-crystalline semiconductor thin-film transistor with a channel length of 4.5 μm.

Next, as shown in FIG. 26, after protective film 51 is formed on source and drain electrodes 41 and 42, contact hole 52 is made through protective film 51. Subsequently, a connecting portion of pixel electrode 53 is filled in contact hole 52, pixel electrode 53 is formed on protective film 51, and alignment film 54 is formed on pixel electrode 53 and protective film 51 so that a circuit array substrate 2 is completed as shown in FIG. 14.

As described above, according to the second embodiment, since the doped impurity concentrations can be made different from each other with respect to different channel-length thin-film transistors 91, 92 and 93 formed on glass substrate 3, respectively, threshold voltages of thin-film transistors 91, 92 and 93 can be independently controlled. Thus, thin-film transistor 91 required for high-frequency operations can be formed on the same substrate and by the same processes as thin-film transistors 92 and 93 required for high-withstand voltages.

In other words, the threshold voltages of different channel-length thin-film transistors 91, 92 and 93 can be easily controlled and such thin-film transistors 91, 92 and 93 can be manufactured by a limited number of process steps. Both short channel, high-frequency thin-film transistor 91 and long channel, high-withstand voltage thin-film transistors 92 and 93 can be made on the same glass substrate 3. In addition, because the method of manufacturing different channel-length thin-film transistors 91, 92 and 93 has the same number of lithography processes for thin-film transistors 91, 92 and 93 and does not substantially increase the number of manufacturing steps for them, circuit array substrate 2 with such thin-film transistors 91, 92 and 93 can be manufactured at an inexpensive cost.

The present invention is applicable to circuit array substrates including, but not limited to, the following thin-film transistors with different characteristics formed on the same glass substrate: CMOS circuits of N-channel type and P-channel type thin-film transistors; N-channel type and P-channel type thin-film transistors in which threshold-voltages are independently set; and thin-film transistors which have the same channel length but large absolute values of threshold voltages in the light of turned-off properties.

In the second embodiment, the impurity is doped into the active layer 11 of short channel thin-film transistor 91. In the case that a certain threshold voltage control is required for portions of active layer 11 corresponding to long-channel thin-film transistors 92 and 93, after the impurity doping is carried out through resist pattern 78 and remaining resist pattern 79 is removed, the impurity may be doped into the entire surface of glass substrate 3.

N-channel type thin-film transistors 91, 92 and 93 are formed in the second embodiment but a N-type impurity, such as phosphorous, can be doped through gate electrodes 16 as a mask pattern to form P-channel type thin-film transistors.

Circuit array substrates of the present invention can be not only used for liquid crystal display devices but can be also applied to organic electro-luminescence display devices.

The present invention is not limited to the embodiments described above. Although the invention has been described in its applied form with a certain degree of particularity, it is understood that the present disclosure of the preferred form can be changed in the details of construction and the combination and arrangement of components may be resorted to without departing from the spirit and the scope of the invention as hereinafter claimed.

What is claimed is:
1. A circuit array substrate, comprising:
an insulation substrate;
switching elements having an active layer of a poly-crystalline semiconductor formed on said insulation substrate; and a photo-electric semiconductor device having a photo-electric sensor portion of a poly-crystalline semiconductor formed on said insulation substrate, wherein an impurity is doped into said active layer of said poly-crystalline semiconductor with an impurity concentration in a process chamber and said impurity is also doped into said photo-electric sensor portion of said poly-crystalline semiconductor with a different impurity concentration from that of said active layer of said poly-crystalline semiconductor in the same process chamber as said active layer of said poly-crystalline semiconductor.

2. A circuit array substrate according to claim 1, wherein said switching elements are thin-film transistors, and said photo-electric semiconductor device is a PIN diode.

3. A circuit array substrate, comprising:

an insulation substrate; and a plurality of switching elements having active layers of a poly-crystalline semiconductor formed on said insulation substrate, wherein an impurity is doped into said active layer of said poly-crystalline semiconductor with an impurity concentration in a process chamber and said impurity is also doped into a photo-electric sensor portion of said poly-crystalline semiconductor with a different impurity concentration from that of said active layer of said poly-crystalline semiconductor in the same process chamber as said active layer of said poly-crystalline semiconductor.

4. A circuit array substrate according to claim 3, wherein said switching elements are thin-film transistors having different channel lengths, and said different impurity concentrations of said active layers of said thin-film transistors are different from each other with respect to said different channel lengths of said thin-film transistors.

* * * * *

UNITED STATES PATENT AND TRADEMARK OFFICE
CERTIFICATE OF CORRECTION

PATENT NO. : 7,061,019 B2 Page 1 of 1
APPLICATION NO. : 10/888755
DATED : June 13, 2006
INVENTOR(S) : Arichika Ishida et al.

It is certified that error appears in the above-identified patent and that said Letters Patent is hereby corrected as shown below:

At column 10, line 46, change "N-type" to --P-type--; same line, delete ",";
        line 47, delete "such as phosphorous,".

Signed and Sealed this

Twenty-first Day of November, 2006

JON W. DUDAS
*Director of the United States Patent and Trademark Office*